US012277986B2

(12) United States Patent
Asaki (10) Patent No.: US 12,277,986 B2
(45) Date of Patent: Apr. 15, 2025

(54) APPARATUSES INCLUDING AND METHODS FOR MEMORY SUBWORD DRIVER CIRCUITS WITH REDUCED GATE INDUCED DRAIN LEAKAGE

(71) Applicant: MICRON TECHNOLOGY, INC., Boise, ID (US)

(72) Inventor: Kenji Asaki, Sagamihara (JP)

(73) Assignee: Micron Technology, Inc., Boise, ID (US)

( * ) Notice: Subject to any disclaimer, the term of this patent is extended or adjusted under 35 U.S.C. 154(b) by 340 days.

(21) Appl. No.: 17/475,206

(22) Filed: Sep. 14, 2021

(65) Prior Publication Data

US 2023/0078117 A1 Mar. 16, 2023

(51) Int. Cl.
*G11C 29/50* (2006.01)
*G11C 11/408* (2006.01)

(52) U.S. Cl.
CPC .... *G11C 29/50004* (2013.01); *G11C 11/4085* (2013.01)

(58) Field of Classification Search
None
See application file for complete search history.

(56) References Cited

U.S. PATENT DOCUMENTS

| 7,545,701 B2* | 6/2009 | Min | G11C 8/08 |
| | | | 365/230.06 |
| 2005/0219934 A1* | 10/2005 | Hanzawa | G11C 8/08 |
| | | | 365/230.06 |
| 2007/0253273 A1* | 11/2007 | Miyamoto | G11C 11/22 |
| | | | 365/230.03 |
| 2009/0207642 A1* | 8/2009 | Shimano | G11C 11/1675 |
| | | | 365/72 |
| 2017/0103798 A1* | 4/2017 | Mochida | G11C 11/4085 |
| 2019/0189186 A1* | 6/2019 | Won | H01L 27/0207 |

* cited by examiner

*Primary Examiner* — Nasima Monsur
(74) *Attorney, Agent, or Firm* — Dorsey & Whitney LLP (57) ABSTRACT

Apparatuses including and methods for memory subword driver circuits with reduced gate induced drain leakage are described. An example apparatus includes a first subword line and a second subword line coupled to the first subword line by a first common transistor where, in response to a test mode signal, a voltage of each of the first and second subword lines is raised to a first voltage and a gate voltage of the first common transistor is raised to a second voltage. In another example apparatus first and second subword drivers are coupled to the first and second subword lines respectively, and a driver circuit is coupled to the first and second subword drivers. The driver circuit outputs a first high signal to cause the first and second subword lines to rise to the first voltage and the gate voltage of the first common transistor to rise to the second voltage.

21 Claims, 9 Drawing Sheets

APPARATUSES INCLUDING AND METHODS FOR MEMORY SUBWORD DRIVER CIRCUITS WITH REDUCED GATE INDUCED DRAIN LEAKAGE

BACKGROUND

A semiconductor memory device, such as a Dynamic Random Access Memory (DRAM), includes a memory cell array having memory cells disposed at intersections between subword lines and bit lines. The semiconductor memory device may include hierarchically structured word lines (WL) and subword lines. The word line is driven by a respective word driver and is positioned at an upper hierarchy, and is selected by a first portion of a row address. The subword line is driven by a respective subword driver and is positioned at a lower hierarchy, and is selected based on a corresponding word line and a FX driver line (FX) selected by a second portion of the row address.

Due to the scaling down of array access devices in semiconductor fabrication, there is growing concerns regarding leak currents related to submicron devices fabricated on a semiconductor substrate such as the gate induced drain leakage (GIDL). Recently, there is a desire to reduce the GIDL current, particularly during a stress testing time, in a semiconductor memory device because of limited current capacity of a memory tester. For example, reducing GIDL in subword drivers of a semiconductor memory device has become desirable in reducing the maximum current capacity of a memory tester, thus, reducing cost of the memory tester and memory testing.

DETAILED DESCRIPTION

Certain details are set forth below to provide a sufficient understanding of examples of various embodiments of the disclosure. However, it is appreciated that examples described herein may be practiced without these particular details. Moreover, the particular examples of the present disclosure described herein should not be construed to limit the scope of the disclosure to these particular examples. In other instances, well-known circuits, control signals, timing protocols, and software operations have not been shown in detail in order to avoid unnecessarily obscuring embodiments of the disclosure. Additionally, terms such as "couples" and "coupled" mean that two components may be directly or indirectly electrically coupled. Indirectly coupled may imply that two components are coupled through one or more intermediate components. Shapes and dimensions of the various semiconductor structures shown by the drawings are not to scale. For example, the schematic diagrams are provided merely as examples, and the dimensions may be modified for an actual semiconductor memory device.

Figure 1:
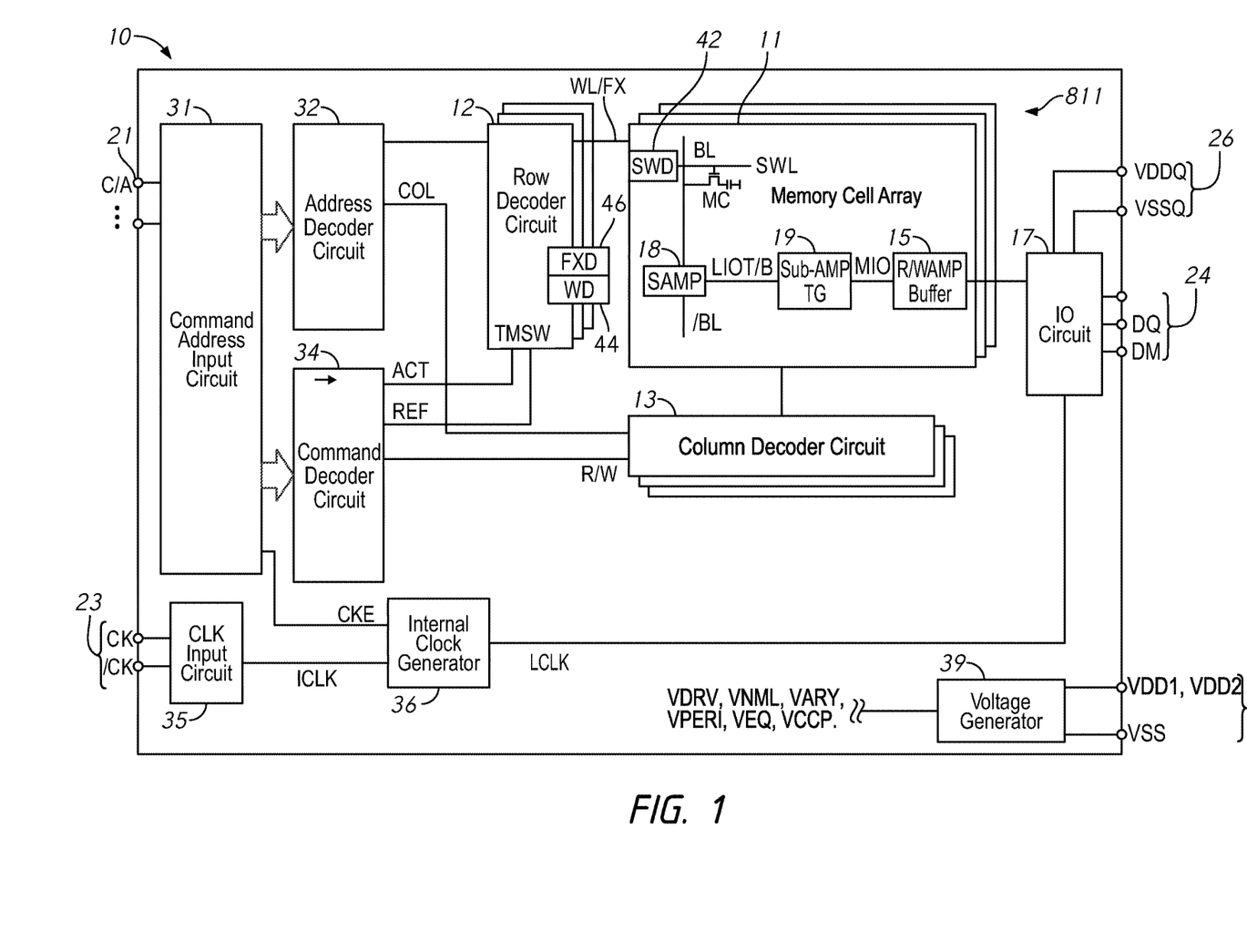
FIG. 1 is a block diagram of an apparatus according to an embodiment in the disclosure.

FIG. 1 is a block diagram of an apparatus 100 according to an embodiment of the disclosure. A semiconductor memory device 10 may be an example of the apparatus 100. The semiconductor memory device 10 may be a dynamic random access memory (DRAM) in some embodiments of the disclosure. The semiconductor memory device 10 includes a memory cell array 11. The memory cell array 11 includes a plurality of subword lines SWL and a plurality of data lines DL that intersect with each other, with memory cells (MC) disposed at the intersections. The SWL may be driven by respective subword drivers SWD 42. For clarity, only one SWL, SWD, DL, and MC are shown in FIG. 1. A plurality of word lines WL and FX driver lines FX may be provided to respective SWDs in the memory cell array 11. For example, a selection of a word line WL and a FX driver line FX is carried out by the row decoder circuit 12, and the selection of the data line DL is carried out by a column decoder circuit 13. In some examples, the FX driver lines FX may be driven by respective FX driver circuits FXD 46. The word lines WL may be driven by respective word drivers WD 44. For example, a semiconductor memory device may have 128 word lines and 128 word drivers providing respective word lines.

In some examples, the semiconductor memory device 10 may include multiple memory cell arrays 11 arranged in multiple memory banks. The semiconductor memory device 10 may also include multiple row decoder circuits 12 and multiple column decoder circuits, each coupled to a respective memory cell array 11.

Commands included in command address (CA) signals provided to command and address terminals 21 are input to a command decoder circuit 34 via a command/address input circuit 31. The command decoder circuit 34 decodes the commands to provide various internal command signals. For example, the internal commands may include a row command signal to select a word line, a column command signal, such as a read command or a write command, to select a data line, and a test mode signal to allow the semiconductor memory device to enter a test mode.

When an activation command is issued and a row address is timely supplied with the activation command, and a column address is timely supplied with a read command, read data is read from a memory cell MC in the memory cell array 11 designated by these row address and column address. More specifically, the row decoder circuit 12 selects a word line WL, FX driver line FX, and subword line SWL indicated by the row address RA so that the associated memory cell MC is subsequently connected to the data line DL. Further, when the memory cell MC is selected by the row address and the associated row is activated by the activation command, the word line WL may be active and the FX driver line FX may be active. This results in the subword line SWL being active. Conversely, when the memory cell MC is not selected, e.g., in a precharge operation, the FX driver line FX may be inactive, and the word line WL may also be inactive. This drives the subword line SWL to a non-active potential, e.g., off-state word line voltage VNWL. With further reference to FIG. 1, the read data DQ is output externally from the data terminals 24 via a read/write amplifier 15 and an input/output circuit 17.

Similarly, when the activation command is issued and a row address are timely supplied with the activation command, and a column address is timely supplied with a write command, the input/output circuit 17 may receive write data DQ at the data terminals 24. The write data DQ is supplied via the input/output circuit 17 and the read/write amplifier 15 to the memory cell array 11 and written in the memory cell MC designated by the row address and the column address.

In some examples, when a test mode is activated, a stress test such as an All Row High (ARH) stress test may be performed. During the ARH stress test, an off state current for transistors in the semiconductor memory device may add up to a significant level. For example, all of the subword lines in the semiconductor are raised to a high voltage level (VCCP, e.g., 3.1 v) in the ARH stress test. Thus, the gate induced drain leakage (GIDL) current by transistors coupling the subword lines may contribute greatly to a total current needed to be supplied by a memory tester during the ARH stress test. This may undermine the maximum current supplying capacity of the memory tester. GIDL current became more noticeable in a semiconductor memory device as the ioff current of a transistor fabricated by the high performance cmos (HPC) process increased, particularly, at a high temperature.

Power supply terminals 25 are supplied with power supply voltages VDD1, VDD2, and VSS. These power supply voltages VDD1, VDD2, and VSS are supplied to an internal voltage generator circuit 39. The internal voltage generator circuit 39 provides various internal voltages, such as, VPP, VARY, VPERI, VEQ, VDRV, VCCP, and VNWL.

Internal potentials VCCP, VNWL are potentials to be mainly used in the row decoder circuit 12, the word drivers WDs 44 and the FX drivers FXDs 46. For example, a FX driver FXD, when selected based upon the address signal ADD, may be configured to drive a potential on the FX driver line FX to a VCCP level corresponding to a high potential (e.g., 3.1 V). When a row is in pre-charge state, an associated subword driver, responsive to an inactive signal on a word line (WL) and an inactive control signal on a FX driver line (e.g., FX, FXF), may be configured to pull down the subword line (SWL) to the internal voltage VNWL (e.g., a non-active potential, which may be a negative voltage).

The internal potential VARY and VEQ are potentials to be used by the sense amplifier 18, transfer gates 19 and/or read/write amplifiers 15. When the sense amplifier 18 is activated, the read data read out is amplified by driving one of the paired data lines to a VARY level with the other one being driven to a VSS level. The internal potential VPERI, VDRV are used as power supply potential for most of the peripheral circuits, such as the command/address input circuit 31. By using the internal potential VPERI having a lower potential than the external potential VDD as the power supply potential of these peripheral circuits, it may be possible to reduce power consumption of the semiconductor memory device 10.

The power supply terminals 26 are supplied with power supply voltages VDDQ and VSSQ. These power supply voltages VDDQ and VSSQ are supplied to the input/output circuit 17. The power supply voltages VDDQ and VSSQ may be the same voltages as the power supply voltages VDD2 and VSS that are supplied to the power supply terminals 25, respectively. However the dedicated power supply voltages VDDQ and VSSQ may be used for the input/output circuit 17 so that power supply noise generated by the input/output circuit 17 does not propagate to the other circuit blocks of device 10.

Figure 2:
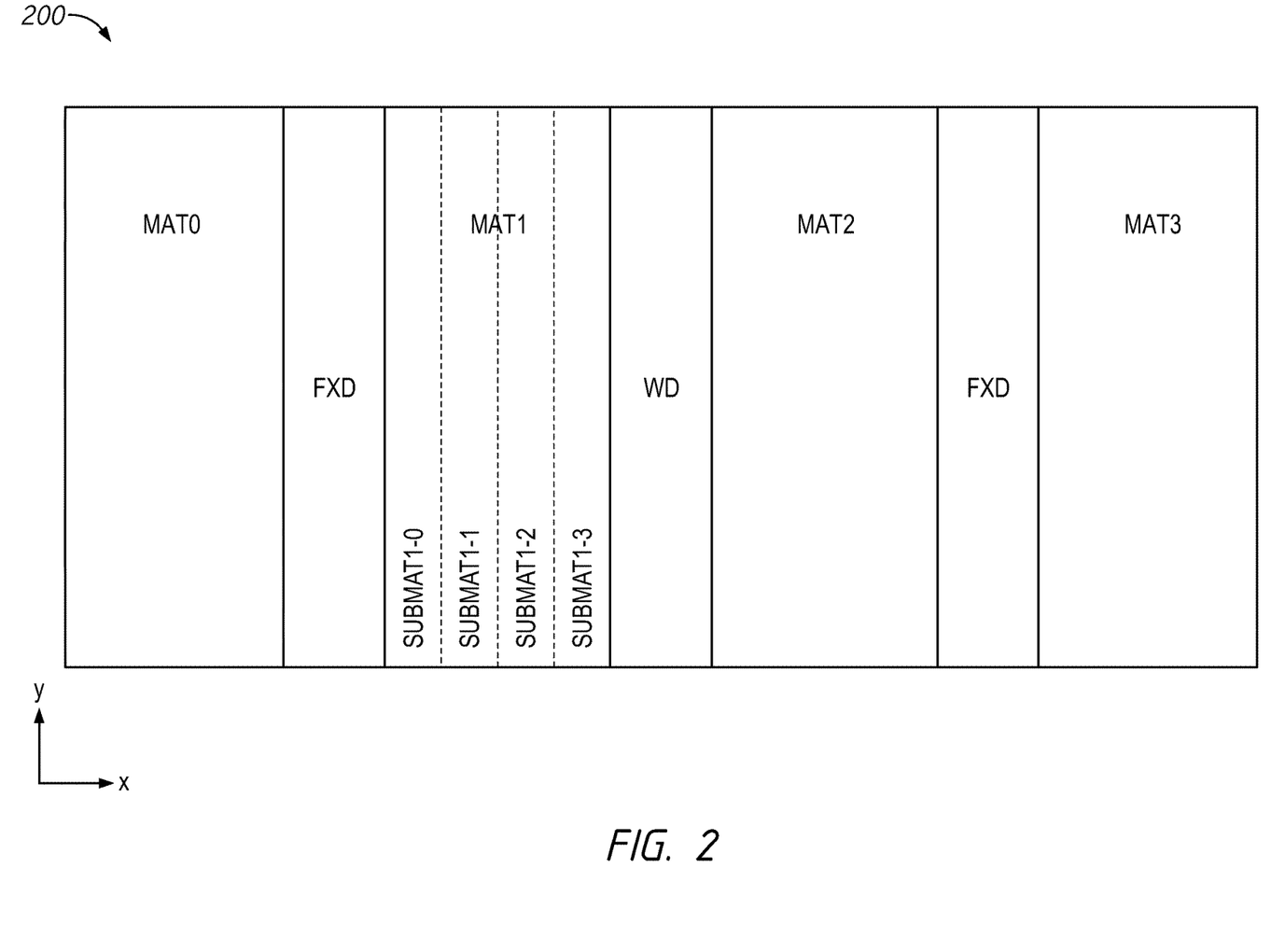
FIG. 2 is a diagram of a configuration of a memory bank of the semiconductor memory device according to an embodiment in the disclosure.

FIG. 2 is a diagram of an example configuration of a memory bank of a semiconductor memory device according to some examples described in the disclosure. For example, each of the memory cell array 11 of the device 10 (FIG. 1) may include a configuration of the bank 200 of FIG. 2 in some embodiments of the disclosure.

In some examples, the memory bank 200 may include a plurality of memory mat regions, such as MAT0-3. In the example shown in FIG. 2, the bank 200 has four memory mat regions, but the bank 200 may include more or less memory mat regions in other examples. As indicated by the dotted lines in memory mat region MAT1, each memory mat region may be divided into multiple sub-regions, e.g., SUB-MAT1-0-3. While the example shown in FIG. 2 includes four sub-regions, memory mat regions MAT0-3 may include more or less sub-regions in other examples. Each sub-region SUBMAT1-0-3 may include a plurality of memory mats (e.g., 64) aligned in the Y-direction. For clarity, the individual memory mats are not shown in FIG. 2. Subword driver SWD blocks (not shown in FIG. 2) may be disposed on the two sides of each memory mat, e.g., in the X direction. Sense amplifier SA blocks may be disposed on the two sides of each memory mat, e.g., in the Y direction. The memory mats of each sub-region SUBMAT1-0-3 may be provided to a corresponding IO (e.g., DQ pad) in some embodiments.

The subword driver operations may be controlled by a row decoder circuit, for example, the row decoder circuit 12 of FIG. 1. When receiving a row address RA, the row decoder selects a subword line SWL by activating an appropriate word driver (WD) and an appropriate FX driver (FXD) indicated by the row address RA. In the example shown in FIG. 2, one block is shown for the word driver WD, however, the word driver WD block may include a plurality of word drivers WDs. Similarly, two blocks are shown for the FX drivers FXDs, but each FX driver FXD block may include a plurality of FX drivers FXDs. For example, if each memory mat region MAT includes four sub-regions and each sub-region includes 64 memory mats, the word driver WD block may include 128 WDs, each configured to activate a corresponding word line (WL). Continuing this example, each FX driver FXD block may include eight FX drivers FXDs, each configured to activate a corresponding FX driver line (FX).

Figure 3:
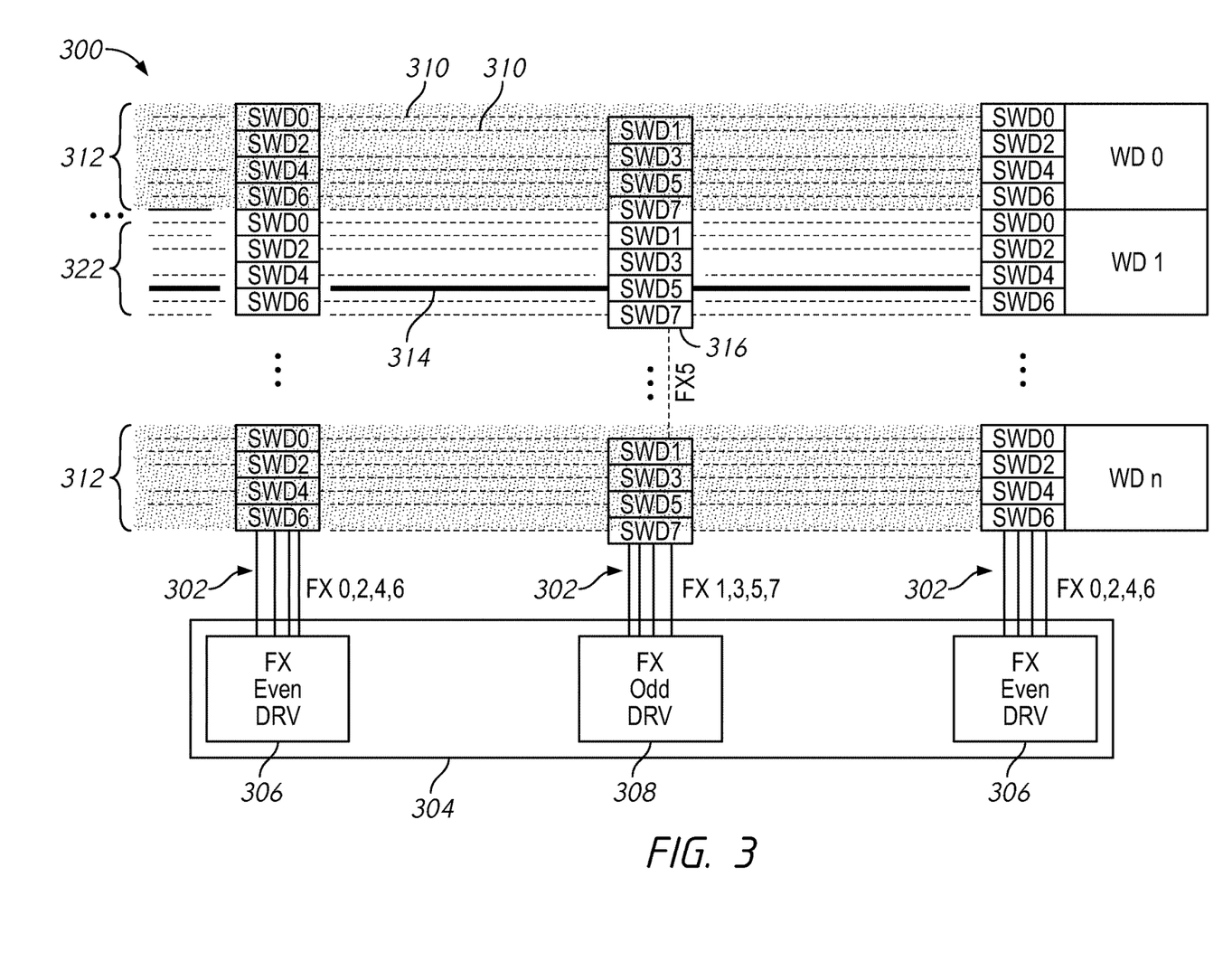
FIG. 3 is a schematic diagram of a portion of a memory bank according to an embodiment in the disclosure.

FIG. 3 is a schematic diagram of a portion of a memory bank 300 according to an embodiment in the disclosure. In some embodiments of the disclosure, a portion of a bank 300 shown in FIG. 3 may be included in the bank 200 of FIG. 2, and/or the memory cell array 11 of FIG. 1.

The memory portion 300 may include multiple subword lines 310, each driven by a respective subword driver SWDj 316. For example, a subword line 314 may be driven by a corresponding subword driver SWD5 associated with a word line driven by a word driver WD1 and also associated with a FX driver line 302 (e.g., FX5) associated with a FX driver 308. In other words, for each FX driver, a corresponding word line WL and FX driver line FX and non-active potential (e.g., off-state word line voltage VNWL) are provided. The signals on the word lines WLs and the control signals on the FX driver lines FXs may be provided by word drivers WD0-n and FX driver FXD block 304, respectively, based upon the row address.

A word line WL may extend over array regions of a respective memory mat to provide the word signal to the subword driver rows SWD0-7 of the memory mat to activate those subword drivers SWD0-7. That is, when a word driver WD is activated, it may provide active word signals to all the subword drivers SWD0-7 of the mat. As will be described below, a FX driver line may include FX and FXF. In some examples, when the FX driver line FX is active, the FX driver line FXF is inactive. Conversely, the FX driver line FXF may be active while the FX driver line FX is inactive. Each FX driver line 302 of FX driver FXD block 304 provides FX driver lines FX and FXF to at least one subword driver SWD in each mat. In the example shown in FIG. 3, the FX driver FXD block 304 includes even FX drivers FXD 306 and odd FX drivers FXD 308. The even FX drivers FXD 306 provide respective FX driver lines FX and FXF to even-numbered subword drivers SWD0, SWD2, SWD4, and SWD6, of each memory mat and odd FX drivers FXD 308 provide respective FX driver lines FX and FXF to odd-numbered subword drivers SWD1, SWD3, SWD5, and SWD7 of each memory mat. However other arrangements may be used in other examples. In the example shown in FIG. 3, each FX driver line of the FX driver FXD block 304 may be coupled to a corresponding subword driver SWD0-7 in each memory mat. For example, FX driver line 5 may be coupled to the subword driver SWD5 of each memory mat.

In the example operation shown in FIG. 3, a row address RA has indicated WD1 should be activated and odd FX driver FXD 308 associated with FX driver line FX 5 should be activated. As shown by the shaded regions 312, subword lines 310 associated with the inactive word drivers WD0, WDn remain inactive, even the subword lines associated with FX driver line FX 5 are active. However, among the subword lines 322 that are associated with activated WD1, the subword line 314 driven by subword driver SWD5 associated with activated WD1 and FX 5 is activated. By way of example, an activated WD may be configured to provide an active signal on the associated word line, and an activated FX driver FXD may be configured to provide an active control signal on the FX driver line (e.g., FX, FXF). Similarly, an activated subword driver may be configured to provide an active signal on the associated subword line. Thus, a selected word line WL of the selected memory mat associated with WD1 is driven to the active potential by the corresponding activated subword driver SWD5.

In some examples, the other subword drivers SWD of the selected memory mat drive the respective unselected subword lines SWL to the non-active potential (e.g., VNWL) to remain inactive. Subword drivers SWD of unselected memory mats MAT (e.g., memory mats associated with WD0 and WDn) remain deactivated, and the subword lines SWL of the unselected memory mats MAT are not provided with a voltage, or instead, provided with a non-active potential (e.g., VNWL) in some examples. Whereas a subword driver SWD is coupled to a FX driver FXD and a word driver WD, in order for a subword line SWL associated with the subword driver SWD to be activated, both the associated FX driver FXD and the word driver WD must be activated.

Figure 4:
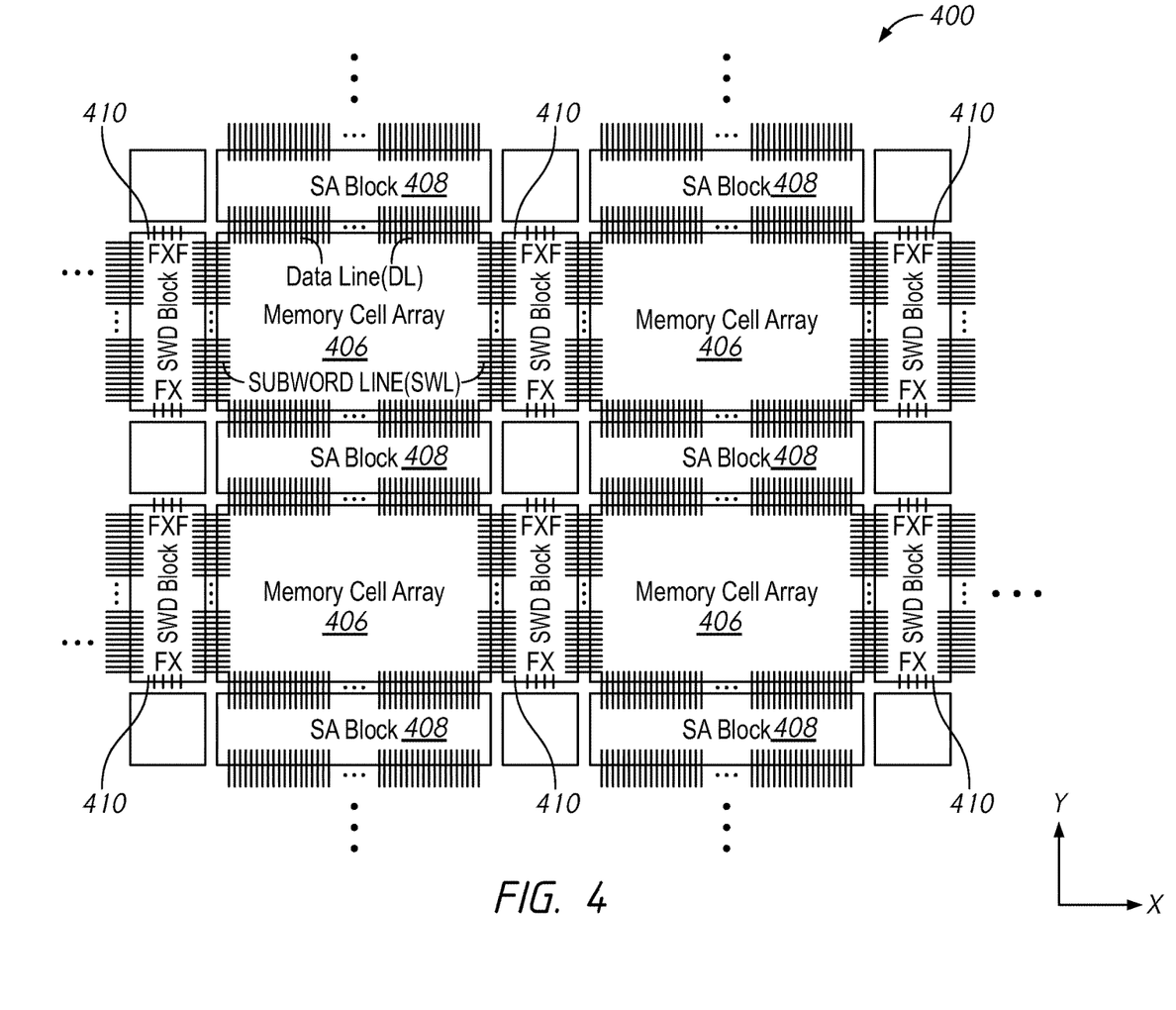
FIG. 4 is a block diagram of a memory configuration according to an embodiment in the disclosure.

FIG. 4 is a block diagram of a memory configuration 400 in a semiconductor memory device according to an embodiment in the disclosure. The memory configuration 400 may be implemented in the semiconductor memory device 10 (FIG. 1). In some embodiments of the disclosure, the memory configuration 400 may be implemented in the memory bank 200 (FIG. 2). For example, the memory configuration 400 may be used for the memory mats included in each of the sub-regions. The memory configuration 400 may include multiple memory cell arrays, e.g., 406. The memory cell arrays 406 may be arranged in rows and columns. Each memory cell array 406 may include multiple memory cells. The memory configuration 400 also includes multiple subword driver (SWD) blocks 410 and multiple sense amplifier (SA) blocks 408. The memory cell arrays 406, SWD blocks 410 and SA blocks 408 may be implemented inside a memory cell array 11 (FIG. 1). In some embodiments of the disclosure, each memory cell array 406 represents a respective memory mat.

The SWD blocks 410 may be arranged on the sides of the memory cell array 406. In a non-limiting example, subword drivers may be placed on one side of a memory cell array and adjacent to the memory cell array to provide signals on respective subword lines for the memory cell array. In another non-limiting example, subword drivers may be placed on two sides of a memory cell array and adjacent to the memory cell array to provide signals on respective subword lines for the memory cell array. For example, the subword lines for a memory cell array may be divided into even- and odd-numbered subword lines. The subword drivers for even-numbered subword lines may be arranged adjacent to a first side, e.g., left side of the memory cell array, whereas subword drivers for odd-numbered subword lines may be arranged adjacent to a second side opposite the first side (e.g., right side) of the memory cell array.

In the example in FIG. 4, each of the SWD blocks may be associated with an adjacent memory cell array on either side of the SWD block. Each of the SWD blocks may be associated with adjacent memory cell arrays on both sides of the SWD block. For example, a SWD block may have a first portion and a second portion, where the first portion is coupled to subword lines of a memory cell array adjacent to a first side (e.g., left side) of the SWD block, and the second portion is coupled to subword lines of a memory cell array adjacent to a second side opposite the first side (e.g., right side) of the SWD block.

Figure 5:
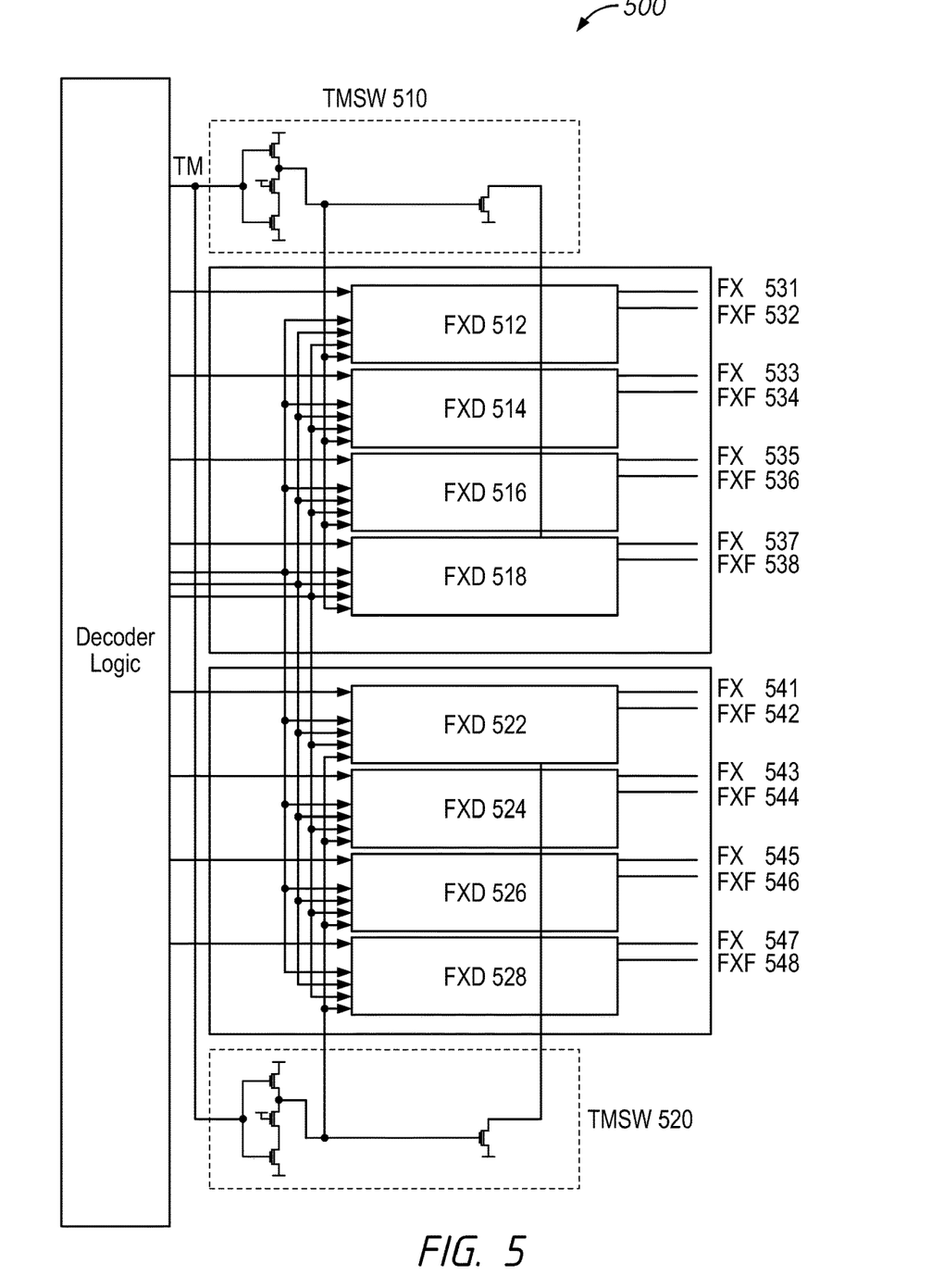
FIG. 5 is a schematic diagram of FX driver block according to an embodiment in the disclosure.

FIG. 5 is a schematic diagram of a FX driver block 500 according to an embodiment of the disclosure. The FX driver block 500 may be an example of the FXD driver block 304 of FIG. 3. The FX driver block 500 includes a decoder logic, and eight FX drivers FXD 512, 514, 516, 518, 522, 524, 526 and 528. The decoder logic is configured to activate corresponding FXD drivers. Two TM switches TMSW 510 and 520 are coupled to the FX driver block 500 in a non-limiting example as shown in FIG. 5. One of the TM switches TMSW 510 is configured to receive a test mode signal and coupled to four of the FX drivers FXD 512, 514, 516 and 518 in the FX driver block 500. The other TM switch TMSW 520 is configured to receive the test mode signal and coupled to other four of the FX drivers FXD 522, 524, 526 and 528 in the FX driver block 500.

As discussed above in relation to FIG. 3, each FX driver FXD is configured to drive corresponding FX driver lines FX and FXF. In FIG. 5, FX driver FXD 512 drives FX driver lines FX 531 and FXF 532. In FIG. 3, the subword driver SWD0 is coupled to a FX driver FXD 306 and a word driver WD 0, as previously described. In order for a subword line SWL associated with the subword driver SWD to be activated, both the associated FX driver FXD and the word driver WD must be activated. In addition to activating the FX driver lines FX and FXF in a memory access operation as described above, the FX driver FXD activates the corresponding FX driver lines FX and FXF during a test mode. In the test mode, the TM switches TMSW 510 and 520 are coupled to the FX drivers FXD 512, 514, 516, 518, 522, 524, 526 and 528 and, in turn, the FX drivers FXD 512, 514, 516, 518, 522, 524, 526 and 528 drive the FX driver lines FXF 532, 534, 536, 538, 542, 544, 546 and 548 to VDRV (e.g., 2.0 v) and FX driver line FX 531, 533, 535, 537, 541, 543, 545 and 547 to VCCP (e.g., 3.1 v).

Figure 6A:
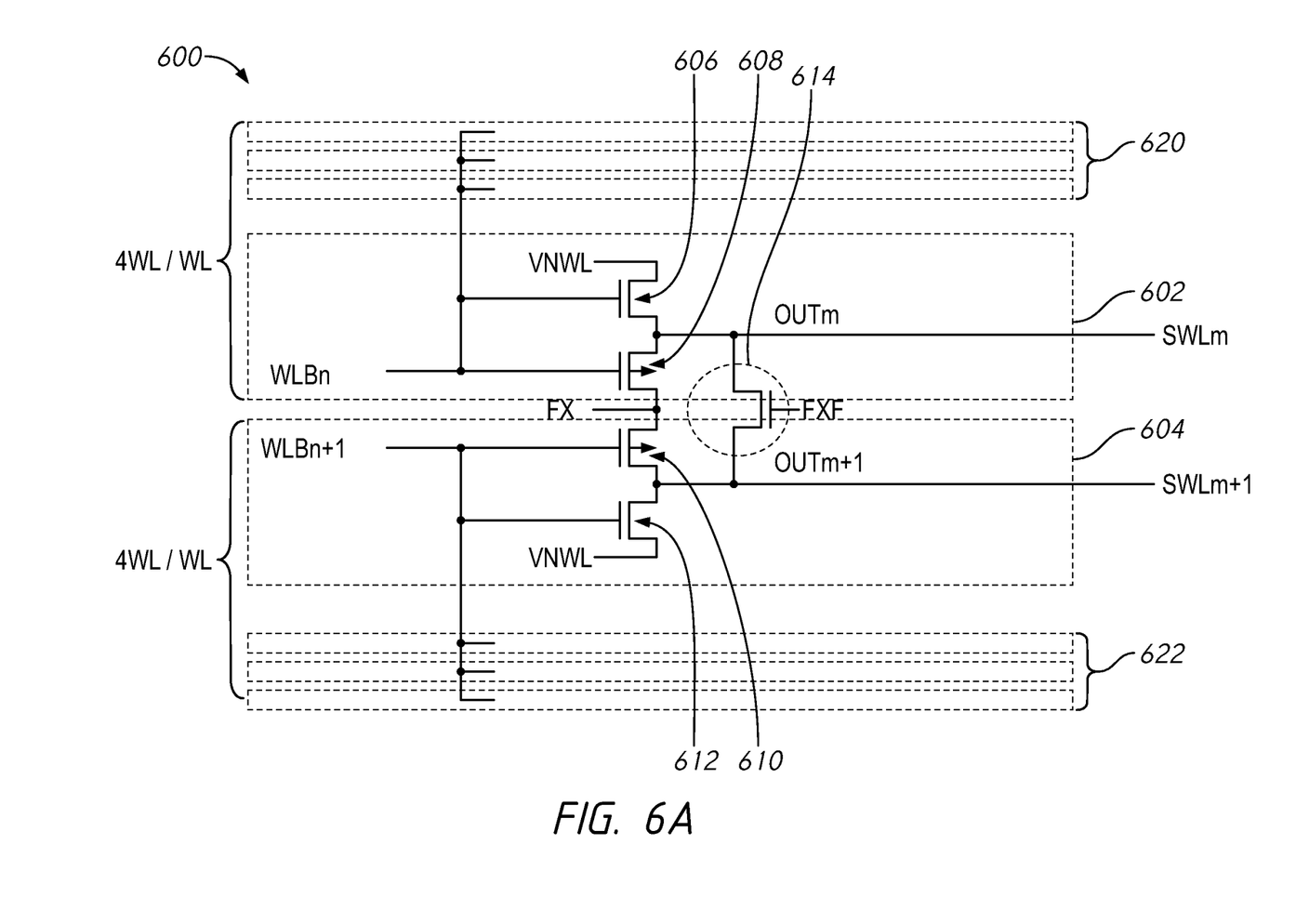
FIG. 6A is a schematic diagram of subword drivers according to an embodiment in the disclosure.

FIG. 6A is a schematic diagram of subword drivers 600 according to an embodiment of the disclosure. In some embodiments of the disclosure, the subword drivers 600 may be included in the subword drivers SWD 42 of FIG. 1, the subword drivers SWD 316 of FIG. 3, and/or the subword driver blocks 410 of FIG. 4.

The subword drivers 600 includes a plurality of subword drivers 620, a subword driver 602 coupled to a subword driver 604 through a common transistor 614, and a plurality of subword drivers 622. The subword driver 602 includes transistors 606 and 608 coupled in series. Gates and drains of the transistors 606 and 608 are coupled to a word line WLBn and a subword line SWLm respectively. A source of the transistor 606 is coupled to a voltage supply providing an off-state word line voltage VNWL and a source of the transistor 608 is coupled to the FX driver line FX. Similarly, a subword driver 604 includes transistors 610 and 612 coupled in series. Gates and drains of the transistors 610 and 612 are coupled to a word line WLBn+1 and a subword line SWLm+1 respectively. A source of the transistor 610 is coupled to the FX driver line FX and a source of the transistor 612 is coupled to a voltage supply providing an off-state word line voltage VNWL. Each of the subword lines is coupled to its respective memory cells in the memory array.

Two subword drivers 602 and 604 are shown in FIG. 6A, further, each of the plurality of subword drivers 620 and 622 may be configured in a similar manner as the subword driver 602 or 604. For example, each of the plurality of subword drivers 620, may also be coupled to the word line WLBn to which the subword driver 602 is coupled. Similarly, each of the plurality of subword drivers, 622, may also be coupled to the word line WLBn+1 to which the subword driver 604 is coupled. In the example shown in FIG. 6A, one word line WL drives four subword drivers to provide signals on four subword lines (only one of the four subword lines is shown). Besides the subword lines SWLm and SWLm+1, one of the four subword lines from the plurality of subword drivers 620 may be coupled to one of the four subword lines from the plurality of subword drivers 622 through a common transistor similar to the common transistor 614. In some embodiments of the disclosure, one of four subword lines from an adjacent plurality of subword drivers may be coupled to one of four subword lines from another plurality of subword drivers through a common transistor similar to the common transistor 614. However, other configurations of coupling two subword lines through a common transistor are possible to suit layout requirements of the memory cell array. Further, coupling of two subword lines through a common transistor may save layout area and may reduce GIDL of the common transistor by controlling the gate voltage of the common transistor through the FX driver line FXF as discussed in detail below.

Each of the subword driver blocks SWD 410 as shown in the non-limiting example of FIG. 4 may include a pair of subword lines that are coupled through a common transistor in a similar manner as the configuration shown in FIG. 6A. In FIG. 6A, the subword drivers 602, 620 are associated with word line WLBn. The subword drivers 604, 622 are associated with a different word line, WLBn+1. In the example as shown in FIG. 6A, the two subword lines from the two subword drivers 602, 604 respectively are coupled through the common transistor 614. In a similar manner, each of the plurality of subword lines from the subword drivers 620 may be coupled by a common transistor to a respective one of the plurality of subword lines from the subword drivers 622. Thus, two subword drivers may form a pair, where outputs of the two subword drivers are coupled to the respective subword lines that are coupled to each other through a common transistor.

In FIG. 6A, the subword line SWLm is coupled to the subword line SWLm+1 through the common transistor 614. In some examples, the common transistor 614 may be an n-channel type transistor. As a common transistor is shared by two subword lines, there may be as many common transistors as a half the number of subword lines in a semiconductor memory device.

In a memory access operation of the semiconductor memory device, the subword line SWLm may be selected to access a particular memory cell from a plurality of memory cells connected to the subword line SWLm by raising its level to VCCP. A respective bit line associated with the memory cell is also selected in a sensing and amplifying phase to access the memory cell.

In the sensing and amplifying phase of the memory access operation, the FX driver line FXF coupled to the gate of the common transistor 614 is lowered to the ground level (e.g., 0 v), so that the subword line SWLm can remain at VCCP level. When the sensing and amplifying phase are completed, FXF at the gate of the common transistor 614 is raised to a higher level, for example to VCCP, to allow the subword line SWLm to lower its voltage level to VNWL (e.g., off-state word line level) which may be below the ground level. For example, the subword line SWLm may be discharged through the activated common transistor 614 to the subword line SWLm+1 which is at VNWL.

When the test mode is activated in the semiconductor memory device, for example by a semiconductor tester, a stress test such as an All Row High (ARH) stress test may be performed. During such a stress test, all of the subword lines in the memory arrays are raised to VCCP level as a means of a stress. During the stress test, a transistor connected to the subword lines, for example the common transistor 614 in FIG. 6A, may be subjected to the gate induced drain leakage (GIDL) current. For example, this may occur when the gate of the common transistor 614 coupled to the FX driver FXF is lowered to the ground level (0v) and the source and drain coupled to the subword lines are raised to VCCP level. In this situation, a voltage between the gate and the drain of the common transistor 614 may reach VCCP level. This voltage may be enough to cause GIDL of the common transistor 614 to be substantial when considering that there are as many transistors with similar configuration as the common transistor 614, which may be as many as half of the number of subword lines in the semiconductor memory device. GIDL by all of the transistors may add up to such a level that the total device current during the stress test may exceed the maximum current capacity of the semiconductor tester. This may undermine the operation of the semiconductor tester. Further, recently, GIDL became more noticeable in a semiconductor memory device as the ioff current of a transistor fabricated by the high performance cmos (HPC) process increased, particularly, at a high temperature.

In order to reduce this GIDL due to all of the common transistors in the memory arrays of the semiconductor memory device, the gates of the common transistors may be raised, for example, from ground level to VDRV, during the stress test by raising the FX driver line FXF to VDRV. During the sensing and amplifying phase of a memory access operation of the semiconductor memory device, the FX driver line FXF coupled to the gate of the common transistor is at the ground level (e.g., 0 v). This is to keep the common transistor coupling the two subword lines from conducting. If one of the two subword lines is selected to access a memory cell, the selected subword line is at VCCP level and the other ones is at VNWL level. In the memory access operation, only a limited number of subword lines are selected for accessing memory cells. Further, during the non-sensing and amplifying phase, the non-selected subword lines are at VNWL level. Thus, GIDL by the common transistors may not be an issue.

In the non-limiting example of FIG. 6A, however, during the stress test, all of the subword lines SWL are raised to VCCP and all of the FX driver lines FX are raised to VCCP. The common transistor 614 coupling the subword lines SWLm and SWLm+1 and the gate of the common transistor is coupled to the FX driver line FXF. Thus, in a situation where all of the subword lines SWL are at VCCP level, even if the FX driver line FXF is raised, for example, to VDRV level, the common transistor 614 and the subword lines SWL would not cause adverse effects as there are no other current paths. Since a voltage between the gate and the drain of the common transistor 614 can be reduced by raising a voltage of the gate coupled to the FX driver line FXF, for example, to VDRV level, GIDL can be reduced. The FX driver line FXF level needs not be limited to VDRV level. For example, in some embodiments of the disclosure, the FX driver line FXF level may be as high as the gate of the common transistor 614 can withstand in order to reduce GIDL. As discussed above, there are as many as almost half the number of the subword lines of the common transistors with the similar configuration as the common transistor 614 within the semiconductor memory device. Thus, reducing GIDL of each of the common transistors may be effective to reduce the total device current of the semiconductor memory device during the stress test in the test mode. The FX driver FXD, in response to a test mode signal, raises the FX driver line FXF to higher than the ground level, for example to VDRV, which may be used to reduce GIDL of the common transistors.

As described above, in the memory access operation, the common transistor 514 that couples the outputs of two subword drivers 502, 504 may allow the current to flow bi-directionally depending on which subword driver is activated. If subword driver 602 is activated (e.g., responsive to an active word line) and the subword driver 604 is deactivated, the current in the common transistor 614 may flow from the activated subword driver 602 to the deactivated subword driver 604 to cause the word line potential of the activated word line WLm (coupled to the output OUTm of subword driver 602) to be pulled down to the non-active potential VNWL (e.g., off-state word line voltage) during pre-charge. Conversely, if subword driver 604 is activated and subword driver 602 is deactivated, the current in the common transistor may flow from the activated subword driver 604 to the deactivated subword driver 602 to cause the word line potential of the activated word line WLm+1 (coupled to the output OUTm+1 of subword driver 604) to be pulled down to the non-active potential VNWL during precharge.

In contrast, during the test mode, the common transistor 614 that couples the two subword lines SWLm and SWLm+1 may allow the current to flow bi-directionally depending on which subword line has a higher voltage. Both of the subword lines SWLm and SWLm+1 are at a high voltage level (e.g., responsive to a test mode signal). The current in the common transistor 614 may flow from one of the subword lines, if it happens to have a higher voltage, to the other one of the subword lines to cause the voltage of the subword lines to be equal, for example at VCCP, during the stress test so that effective stresses are applied to the memory mat of the semiconductor memory device.

Figure 6B:
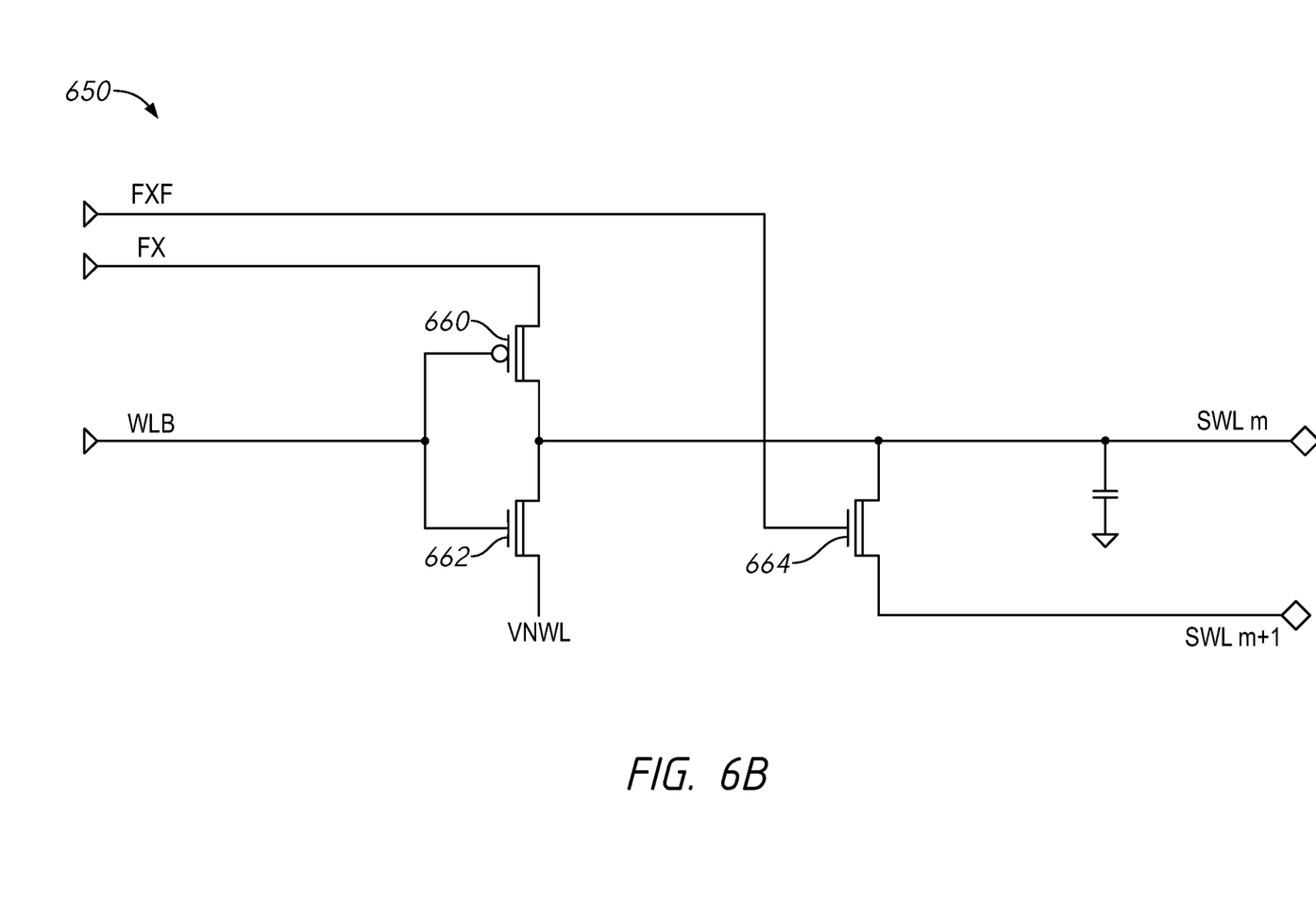
FIG. 6B is a schematic diagram of a subword driver according to an embodiment in the disclosure.

FIG. 6B is a schematic diagram of a subword drivers 650 according to an embodiment of the disclosure. The subword driver 650 may be an example of one of the subword drivers 600 in FIG. 6A. The subword driver 650 includes transistors 660 and 662 coupled in series. Gates of the transistors 660 and 662 are coupled to a word line WLB. A source of the transistor 662 is coupled to VNWL and a source of the transistor 660 is coupled to the FX driver line FX. Drains of the transistors 660 and 662 are coupled to a subword line SWLm which, in turn, is coupled to its respective memory cells in the memory array. The subword line SWLm is also coupled to a subword line SWLm+1 through a common transistor 664. A gate of the common transistor 664 is coupled to the FX driver line FXF.

In a memory access operation of the semiconductor memory device, a voltage of the gate of the common transistor 664 is at the ground level when a memory cell coupled to the subword line SWLm is selected to be read. Because the voltage of the gate is at ground level, the common transistor 664 is not conducting, the subword line SWLm can maintain its voltage at VCCP when it is being selected. The gate voltage of the common transistor 664 may be raised to, for example VDRV, by the FXD driver line FXF when the memory cell is no longer selected. As the common transistor 664 is now turned on, the voltage of the subword line SWLm will be lowered to VNWL through the common transistor 664 and the subword line SWLm+1 which is coupled to VNWL through a N-type transistor, in a similar manner as the subword driver 604 of FIG. 6A.

In contrast, during the stress test, the gate of the common transistor 664 may be at a voltage higher than the ground level but lower than VCCP, for example at VDRV (e.g., 2.0v). Thus, the common transistor 664 that couples the two subword lines SWLm and SWLm+1 may be turned on and, allow the current to flow bi-directionally depending on which subword line has a higher voltage. During the stress test, both of the subword lines SWLm and SWLm+1 are at a high voltage level (e.g., responsive to a test mode signal), for example at VCCP. The current in the common transistor 664 may flow from one of the subword lines, if it happens to have a higher voltage, to the other one of the subword lines to cause the voltage of the subword lines to be equal, for example at VCCP, during the stress test. This way, a voltage between the subword lines SWLm and SWLm+1 and the gate of the common transistor 664 is reduced to, for example VCCP-VDRV, rather than being at VCCP-Ground. Thus, effective stresses are still applied to the memory mat of the semiconductor memory device by having all subword lines at VCCP, while reducing the GIDL because the voltage between the gate and the drain of the common transistor 664 is reduced during the stress test.

Referring back to FIG. 6A, when the semiconductor memory device is in an active memory access operation, a selected subword line, for example SWLm in FIG. 6A, may be in an active high state with a high potential voltage VCCP to access a memory cell. After accessing the memory cell, the selected subword line SWLm with VCCP may be discharged through the common transistor 614 coupling a pair of subword lines SWLm and SWLm+1 to VNWL voltage level. The common transistor coupled to the subword line SWLm+1 is further coupled to VNWL through the transistor 612 as shown in FIG. 6A. Similarly, the subword line SWLm+1 may be selected to be in the active high state with VCCP voltage. After accessing a memory cell, the selected subword line SWLm+1 with VCCP may be discharged through the common transistor 614 coupling the pair of subword lines SWLm and SWLm+1 to VNWL voltage level. The common transistor coupled to the subword line SWLm is further coupled to VNWL through the transistor 606.

Figure 7A:
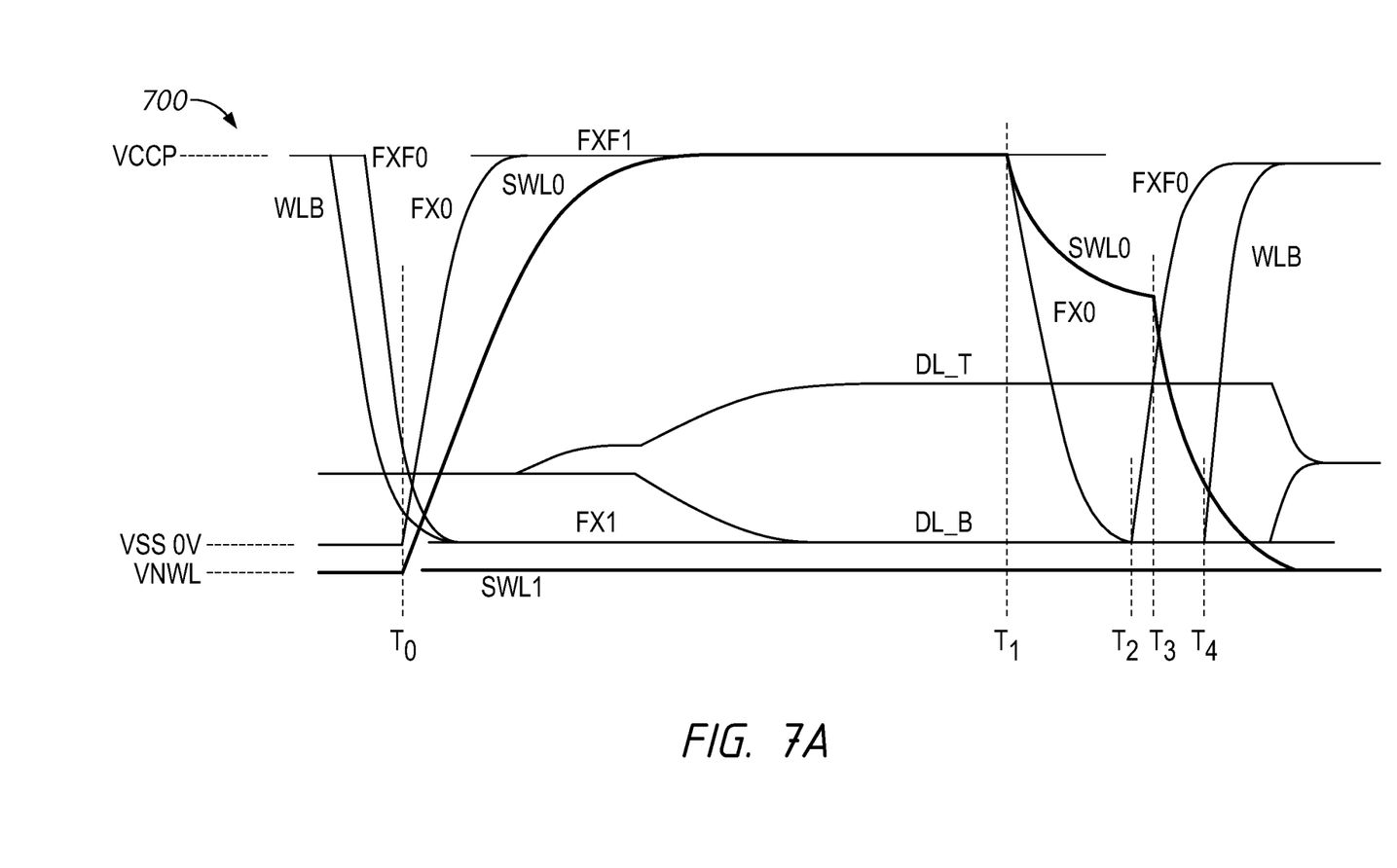
FIG. 7A is a timing diagram of various signals in a memory access operation of a subword driver according to an embodiment in the disclosure.

FIG. 7A is a timing diagram 700 of various signals in a memory access operation of a subword driver according to an embodiment of the disclosure. In a non-limiting example of FIG. 7A, timing diagram 700 shows the operation of a subword driver during a memory access operation (e.g., activation). The subword drivers 602, 604 of FIG. 6A may be operated according to the example operation of timing diagram 700. However, the example of FIG. 7A is not limited to the specific configuration of the subword drivers in FIG. 6A.

Timing diagram 700 shows the states of word line WLB, the FX driver lines FX0, FXF0, and the subword line SWL0. The state on the word line WLB may be active low and the word line WLB may be driven by a respective word driver, e.g., WD in FIGS. 1-3. FX driver lines FX and FXF may be driven by a FX driver FXD, such as a FX driver shown in FIGS. 1-3. In some examples, as an illustration, the timing diagram 700 will be described with reference to the subword driver 602 of FIG. 6A. For example, the WLB in the timing diagram 700 may correspond to the word line WLBn in FIG. 6A; FX0, FXF0 may correspond to FX, FXF in FIG. 6A respectively. SWL0 may correspond to the subword line SWLm and provided by the subword driver 602 in FIG. 6A. FX1, FXF1 and SWL1 may correspond to the driver/word lines of another subword driver associated with WLBn (e.g., one of the additional subword drivers 620).

At some time before T0, an activation signal ACT may be received by a row decoder circuit (e.g., 12 in FIG. 1). An address signal may be provided to the semiconductor memory device with the ACT signal to select a word driver and a subword driver for activation. For example, the word line WLB may transition to an active state (e.g., 0 v VSS in the example shown in FIG. 7A), the state on the FX driver line FX0 may become active high, and the FX driver line FXF0 may become active low. At or around time T0, referring to FIG. 6A, selected subword line SWLm may be driven to an active state (e.g., a high potential VCCP) responsive to the activation of WLBn, FX0, and FXF0. For example, transistor 608 in the subword driver 602 may be active and transistors 606 and 614 in the subword driver 602 may be inactive to drive the selected subword line SWLm (shown as SWL0 in FIG. 7A). The subword line SWLm may be coupled to the VCCP of FX driver line FX0 via transistor 608. During such time, the memory cells (not shown) selected by the subword line SWL0 may be accessed.

At or around time T1, a precharge command may be received by the semiconductor memory device. In response, an internal precharge signal PRE (not shown in FIG. 7A) may transition to an active state. Responsive, at least in part to the precharge signal PRE, the FX driver associated with FX0 may be deactivated, and the FX driver line FX0 may be decoupled from the VCCP. As the potential on the FX0 line decreases, the state of the word line WLB is still low. The subword line SWL is pulled down by the p-channel type transistor 608 to a lower voltage so the potential on the SWL line decreases.

At or around time T2, the FX driver line FXF0 may be inactive and becomes high. This causes the n-channel type transistor 614 to turn on and pull down the potential on the subword line SWL faster toward the non-active potential VNWL at or around time T3. This is possible because the common transistor 614 is coupled to the subword driver 604 associated with a different word line WLBn+1. At this time, the word line WLBn coupled to the subword driver 602 is still active (e.g., at logic low), while other word lines, such as WLBn+1, are unselected (e.g., at logic high). As such, the n-channel type transistor 612 in the subword driver 604 is turned on to couple the non-active potential VNWL to the drain/source of the common transistor 614.

At or around time T4, the word line WLB becomes inactive and the potential on WLB increases. This causes the p-channel type transistor 608 to turn off and the n-channel type transistor 606 to turn on, which further helps to pull down the potential at the output OUTm of the subword driver 602 to the non-active potential VNWL.

Note the subword line SWL0 becomes deactivated after time T1, and the potential on the subword line SWL0 decreases at a faster rate at an intermediate voltage (e.g., a mid-point at T3) during a limited pre-charge time. This is facilitated by the common transistor 614. The operation of reducing the voltage of the subword line SWL0 by decreasing FX0 during the pre-charge at the intermediate point mitigates a row hammer issue that might occur in a semiconductor memory device. Further, this operation reduces the voltage difference across the source/drain (VDS) for the n-channel type transistor 606. This may prevent deterioration of the transistor due to hot carriers, thus, improve the reliability of the subword driver.

The timing diagram 700 will be the same for the subword driver 604 of FIG. 6A when memory cells coupled to the subword line SWLm+1 are accessed. In such case, the WLB in the timing diagram 700 may correspond to the word line WLBn+1 in FIG. 6A; FX0, FXF0 may correspond FX, FXF in FIG. 6A respectively. SWL0 may correspond to the subword line SWLm+1 and may be driven by the subword driver 604 in FIG. 6A. FX1, FXF1 and SWL1 may correspond to the FX driver lines and subword line of another subword driver associated with WLBn+1 (not shown in FIG. 6A). The operation of the subword driver 604 is the same as that of the subword driver 602 and will not be repeated, with the exception that the subword driver 604 is driven by a different word line WLBn+1. Further, at time T3 when the subword line SWL0 (e.g., subword line SWLm+1) is driven to the intermediate voltage, the common transistor 614 will be turned on to drive the subword line SWL0 faster toward the non-active potential VNWL. This is facilitated by the n-channel type transistor 606 of the subword driver 602, which is turned on (by an inactive word line WLBn) to couple the VNWL to the drain/source of the common transistor 614.

Figure 7B:
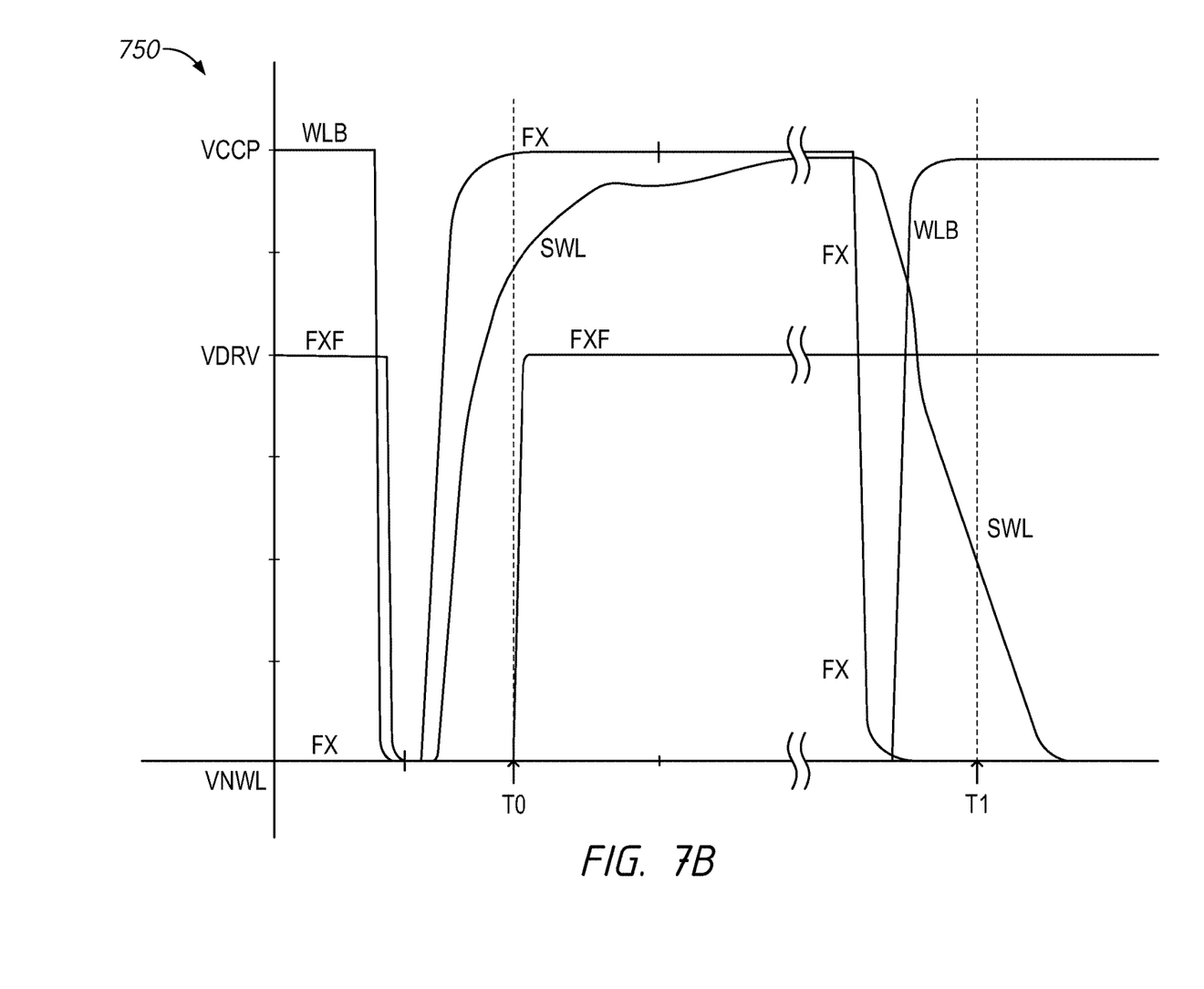
FIG. 7B is a timing diagram of various signals in a memory mat during a stress test according to an embodiment in the disclosure.

FIG. 7B is a timing diagram of various signals in the semiconductor memory device during a stress test according to an embodiment in the disclosure. The timing diagram 750 shows the states of word line WLB, the FX driver lines FX, FXF, and the subword line SWL as the semiconductor memory device enters and exits the stress test at T0 and T1 respectively.

At some time before T0, the semiconductor memory device transitions to an activate-precharge phase, the word line WLB is lowered to the ground level from VCCP as the word line WLB operates as active low. The FX driver line FXF, which is coupled to a gate of a common transistor, for example the transistor 614 in FIG. 6A, is also lowered to the ground level from VDRV. As the common transistor stops conducting, two subword lines, for example SWLm and SWLm+1 in FIG. 6A, coupled to the common transistor now behave independently of each other. As the activate-precharge phase starts, the FX driver line FX rises from the ground level to VCCP and the subword line SWL starts to rise from VNWL toward VCCP.

At or around time T0, a test mode signal may be received by the semiconductor memory device. If the test mode signal is for a stress test, the TM switch TMSW (e.g., TMSWs 510 and 520 of FIG. 5) transitions to a stress test mode. Responsive, at least in part to an output of the TMSW, the FX driver causes FXF to rise to VDRV, as FX and SWL continue to rise toward VCCP. In this manner, stresses are applied to the subword line SWL and, in similar manners, to each of the subword lines in the memory mat until the stress test ends at around T1. In this stress test, each of the subword lines is kept at VCCP while the gate of the respective common transistor remains at VDRV, thus, reducing total GIDL of the semiconductor memory device during the stress test. Since the wave forms in FIGS. 8A and 8B are non-limiting examples of wave forms during a stress test, there may be several variations of subjecting the semiconductor memory device to stresses based at least on a memory testing environment.

In contrast to operational activation modes of the semiconductor memory device, during the stress test in the test mode of the semiconductor memory device, all of the subword lines may be driven by all of the subword drivers to an active level (e.g., VCCP) to apply the stress to the memory array. Further, all of the FX drivers FXD may drive all of the FX driver lines FXF to a higher voltage than the ground level voltage, for example to VDRV level, so that the voltage between the gate of the common transistor 614 is between VCCP and the ground level (e.g., VDRV) to reduce GIDL of the common transistor 614. In certain situations, common transistors located in an edge area of the memory area, the gate voltage of the common transistors in the edge area may remain at the ground level during the test mode.

FIGS. 1-7 provide various advantages in reducing GIDL of the semiconductor memory device during the stress test in the test mode. For example, common transistors in adjacent subword drivers are placed between outputs of the adjacent subword drivers. The gate of each of the common transistors is coupled to a driver line which raises its voltage to a higher level than the ground level. This configuration reduces a voltage between the gate and the drain of each of the common transistors, resulting in reducing GIDL of each of the common transistors. This reduction of GIDL in each of the common transistors in the semiconductor memory device, in turn, results in reducing the total current of the semiconductor memory device during the stress test, so that the maximum current limit of a semiconductor memory tester would not be exceeded.

From the foregoing it will be appreciated that, although specific embodiments of the disclosure have been described herein for purposes of illustration, various modifications may be made without deviating from the spirit and scope of the disclosure. Accordingly, the scope of the disclosure should not be limited any of the specific embodiments described herein.

What is claimed is:

1. An apparatus comprising:
   a first subword line;
   a second subword line coupled to the first subword line by a first common transistor;
   wherein, in response to a test mode signal for entering a test mode, a voltage of each of the first and second subword lines is raised to a first voltage from a third voltage and a gate voltage of the first common transistor is raised to a second voltage from a ground voltage, wherein the second voltage is between the first and third voltages and higher than the ground voltage and wherein the gate voltage of the first common transistor remains at the second voltage during the test mode;
   a third subword line coupled to an off-state word line voltage through a second common transistor; and
   a fourth subword line coupled to the off-state word line voltage through a third common transistor, wherein the off-state word line voltage is below the ground voltage and wherein, in response to the test mode signal, the second and third common transistors are configured to be turned off.

2. The apparatus of claim 1, wherein, in a memory access operation, a voltage of a selected subword line is raised to the first voltage from the third voltage, and a voltage of non-selected subword lines are lowered to the third voltage.

3. The apparatus of claim 1, further comprising:
   first and second subword drivers coupled to the first and second subword lines respectively; and
   a driver circuit coupled to the first and second subword drivers;
   wherein, in response to the test mode signal, the driver circuit provides a first active signal to the first and second subword drivers to cause the first and second subword lines to be driven to the first voltage and the gate voltage of the first common transistor to be driven to the second voltage.

4. The apparatus of claim 1, further comprising:
   a word driver coupled to a plurality of subword drivers, each of the plurality of subword drivers is configured to drive an even subword line or an odd subword line, each coupled to a plurality of memory cells;
   a driver circuit block comprising an even driver circuit and an odd driver circuit, the even driver circuit coupled to a plurality of even subword drivers and the odd driver circuit coupled to a plurality of odd subword drivers.

5. The apparatus of claim 1, further comprising:
   a test mode circuit configured to provides the test mode signal.

6. The apparatus of claim 5, wherein the test mode circuit comprises a spare logic.

7. The apparatus of claim 1, wherein the first voltage is equal to or higher than the second voltage.

8. A method comprising:
   entering a test mode, in response to a test signal;
   raising a voltage of a first subword line by a first subword driver to a first voltage from a third voltage;
   raising a voltage of a second subword line by a second subword driver to the first voltage from the third voltage;
   raising a voltage of a gate of a first common transistor coupled between the first and second subword lines to a second voltage from a ground voltage, wherein the second voltage is between the first and third voltages and higher than the ground voltage and wherein the voltage of the gate of the first common transistor remains at the second voltage during the test mode
   lowering a voltage of a gate of a second common transistor coupled between a third subword line and an off-state word line voltage; and
   lowering a voltage of a gate of a third common transistor coupled between a fourth subword line and the off-state word line voltage, wherein the off-state word line voltage is below the ground voltage and wherein, in response to the test signal, the second and third common transistors are configured to be turned off.

9. The method of claim 8, wherein the entering the test mode comprises:
   activating a test mode switch to provide a switch signal to driver circuits;
   causing the driver circuits to activate subword drivers, and
   causing the subword drivers to drive the first and second subword lines.

10. The method of claim 8, wherein the first voltage is equal to or higher than the second voltage.

11. The method of claim 8, further comprising:
   raising a voltage of sources of two p-type transistors driving the first and second subword lines respectively to the first voltage.

12. The method of claim 8, wherein the first subword line is driven by a first p-type transistor and a first n-type transistor coupled in series and gates of the first p-type transistor and the first n-type transistor are coupled to a first word line, and the second subword line is driven by a second p-type transistor and a second n-type transistor coupled in series and gates of the second p-type transistor and the second n-type transistor are coupled to a second word line.

13. A semiconductor memory device comprising:
   a test mode switch configured to cause the semiconductor memory device to activate a stress test in response to a test mode signal,
   a first common transistor configured to share voltages of a first subword line and a second subword line when a first voltage of a gate of the common transistor is higher than a threshold voltage of the first common transistor;
   wherein responsive to the test mode signal, the first voltage is raised from a ground level voltage and wherein the first voltage is higher than a ground level voltage and lower than the threshold voltage during the stress test and a second voltage of the first and second subword lines is higher than the threshold voltage during the stress test;
   a second common transistor configured to couple a third subword line to an off-state word line voltage; and
   a third common transistor configured to couple a fourth subword line coupled to the off-state word line voltage, wherein the off-state word line voltage is below the ground voltage and wherein, in response to the test mode signal, the second and third common transistors are configured to be turned off.

14. The semiconductor memory device of claim 13, further comprising:
   a first subword driver coupled to the first subword line; and
   a second subword driver coupled to the second subword line,
   wherein the first and second subword drivers are configured to raise the first and second subword lines to the second voltage during the stress test mode.

15. The semiconductor memory device of claim 13, further comprising:
   a driver circuit, coupled to the gate of the first common transistor, configured to output a control signal in response to the test mode signal,
   wherein the control signal is at the first voltage during the stress test.

16. The semiconductor memory device of claim 15, wherein the control signal is at the ground level voltage during an activation and precharge phase.

17. An apparatus comprising:
   a first subword line coupled to a drain of a first n-type transistor and a drain of a first p-type transistor;
   a second subword line coupled to a drain of a second n-type transistor and a drain of a second p-type transistor;
   a first common transistor coupled between the first subword line at a drain of the first common transistor and a third subword line at a source of the first common transistor and configured to provide the first subword line to an off-state word line voltage, and
   a second common transistor coupled between the second subword line at a drain of the second common transistor and a fourth subword line at a source of the second common transistor and configured to provide the second subword line to the off-state word line voltage,
   wherein a gate voltage of the first and second common transistors is coupled to a driver line,
   wherein the first and second subword lines are disposed in an edge area of a memory mat,
   wherein, in an activation and precharge phase, a gate voltage of each of the first and second n-type transistors and the first and second p-type transistors is lowered to a ground level voltage, a voltage of the sources of the first and second p-type transistors is raised to a second voltage and the gate voltage of the first and second common transistors is lowered to the ground level voltage from a first voltage.

18. The apparatus of claim 17, wherein, in response to a test mode signal, the gate voltage of each of the first and second common transistors remains the same.

19. The apparatus of claim 17, wherein the second voltage is higher than the off-state word line voltage.

20. The apparatus of claim 17, wherein the first voltage is lower than the second voltage.

21. The apparatus of claim 17, wherein the apparatus is a semiconductor memory device.

* * * * *